(12) United States Patent
Siddiqi et al.

(10) Patent No.: US 12,277,373 B1
(45) Date of Patent: Apr. 15, 2025

(54) SYSTEM AND COMPUTER-READABLE MEDIUM FOR IMPROVING THE CRITICAL PATH DELAY OF A FPGA ROUTING TOOL AT SMALLER CHANNEL WIDTHS

(71) Applicant: KING FAHD UNIVERSITY OF PETROLEUM AND MINERALS, Dhahran (SA)

(72) Inventors: Umair Farooq Siddiqi, Dhahran (SA); Sadiq Mohammed Sait, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 0 days.

(21) Appl. No.: 18/793,209

(22) Filed: Aug. 2, 2024

(51) Int. Cl.
*G06F 30/347* (2020.01)
*G06F 30/3953* (2020.01)

(52) U.S. Cl.
CPC ........ *G06F 30/347* (2020.01); *G06F 30/3953* (2020.01)

(58) Field of Classification Search
CPC ............................ G06F 30/347; G06F 30/3953
See application file for complete search history.

(56) References Cited

U.S. PATENT DOCUMENTS

| | | | |
|---|---|---|---|
| 8,595,671 B2 | 11/2013 | He | |
| 2005/0007155 A1* | 1/2005 | Young | H01L 27/11898 257/E27.11 |
| 2005/0076338 A1 | 4/2005 | Merril et al. | |
| 2010/0218146 A1* | 8/2010 | Platzker | G06F 30/327 716/103 |

FOREIGN PATENT DOCUMENTS

| | | |
|---|---|---|
| CN | 104462726 B | 6/2018 |
| WO | WO 2022161153 A1 | 8/2022 |

OTHER PUBLICATIONS

Chang, Yen-Jung, et al. "NTHU-Route 2.0: a robust global router for modern designs," IEEE Transactions on Computer-Aided Design of Integrated Circuits and Systems, vol. 29., No. 12 (2010): 1931-1944.

* cited by examiner

*Primary Examiner* — Jack Chiang
*Assistant Examiner* — Aric Lin
(74) *Attorney, Agent, or Firm* — Oblon, McClelland, Maier & Neustadt, L.L.P.

(57) ABSTRACT

A system and method for routing Field Programmable Gate Arrays (FPGAs) includes an input device for acquiring a netlist with defined source, sink, and intermediate nodes, and processing circuitry that features a design router. The router leverages a negotiated-congestion routing component, which promotes the shared use and negotiation for intermediate nodes. The negotiation process employs a congestion cost based on several factors, including base, historical, and present usage costs, alongside node capacity. This system is characterized by a historical cost function focused on the base cost of nodes, favoring the use of those with costs below a specified threshold. A display device incorporated within the system allows for the continuous monitoring of the routing procedure and the efficiency of resource usage. The technology aims to streamline FPGA design by optimizing signal routing for performance and area efficiency.

20 Claims, 8 Drawing Sheets

SYSTEM AND COMPUTER-READABLE MEDIUM FOR IMPROVING THE CRITICAL PATH DELAY OF A FPGA ROUTING TOOL AT SMALLER CHANNEL WIDTHS

STATEMENT REGARDING PRIOR DISCLOSURE BY THE INVENTORS

Aspects of this technology are described in an article U. F. Siddiqi and S. M. Sait, "On improving the critical path delay of PathFinder at smaller channel widths," 2023 22nd International Symposium on Communications and Information Technologies (ISCIT), Sydney, Australia, 2023, pp. 127-132. The conference was held 16-18 Oct. 2023. The article was published online Jan. 3, 2024, and is herein incorporated by reference in its entirety.

STATEMENT OF ACKNOWLEDGEMENT

The authors would like to acknowledge the support provided by the Deanship of Scientific Research (DSR) at King Fahd University of Petroleum & Minerals (KFUPM), Dhahran, Saudi Arabia, for supporting this work.

BACKGROUND

Technical Field

The present disclosure is directed to the field of computer-aided design (CAD) for field programmable gate arrays (FPGAs) for improving the path delay of a FPGA routing tool.

Description of Related Art

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Field Programmable Gate Arrays (FPGAs) are integrated circuits that can be (re)programmed after fabrication to implement digital designs, as their functionalities are not fixed during the production process. For this purpose, the FPGA fabric consists of a large number of programmable logic blocks. Each of the programmable logic blocks can implement a small amount of digital logic, and programmable routing resources that allow the logic block inputs and outputs to be connected to form larger circuits.

Logic blocks from a network of programmable logic blocks are interconnected with a hierarchy of reconfigurable interconnects. Due to such interconnection capability, the intricate wiring of blocks can form various configurations of logic gates. These logic blocks are adaptable to execute complex combinational functions or to serve the fundamental roles of simple logic gates, such as AND and XOR operations. In addition to logic functions, FPGAs frequently incorporate memory elements ranging from basic flip-flops to more elaborate memory blocks.

The FPGA computer-aided design (CAD) flow encompasses synthesis, technology mapping, packing, placement, and routing, converting a digital circuit description in a hardware design language into an FPGA configuration bitstream. Routing is significant in this CAD flow, primarily because the delay in a circuit implemented within an FPGA is primarily attributable to routing delays, rather than logic block delays. Furthermore, a significant portion of an FPGA's real estate is dedicated to programmable routing. Notably, the efficiency of an FPGA router is gauged by metrics such as fast runtime and high-quality configurations concerning a total wire length and critical path delay of the circuit. The optimal configuration should judiciously utilize available resources while minimizing both wire length and critical path delay.

During the routing phase, the programmable routing architecture of an FPGA is typically modeled as a routing resource graph (RRG). Given the RRG of a target FPGA device and the netlist of a placed circuit, an FPGA router determines legal routes for each net, which refers to wires transporting a signal between a source and one or more sinks in the circuit. This task corresponds to the NP-complete problem of identifying disjoint routing trees in the graph, known for its time-intensive nature. As FPGAs and circuits grow in size, routing runtime escalates to levels that are impracticable.

Routing holds pivotal importance in the FPGA toolflow, as FPGAs possess a finite number of discrete routing resources, and the efficacy of an FPGA router directly influences the performance of an application netlist on a target device. Currently, Pathfinder stands as the state-of-the-art FPGA routing algorithm. Employing an iterative, negotiation-based approach, Pathfinder initially routes nets without considering resource sharing. Subsequent iterations dynamically adjust the cost of utilizing a resource based on the level of congestion and historical usage, compelling nets to negotiate for routing resources. Pathfinder's adaptability, operating on a directed graph abstraction of an FPGA's interconnect structure, renders it suitable for routing netlists on any FPGA represented as a directed routing graph.

A net comprises a source node and one or more sink nodes, constituting a fundamental element within any FPGA design, typically numbering in the thousands or more, collectively referred to as a netlist. The router is configured to determine the interconnections between the source nodes and sink nodes of a placed netlist. A routing tree is a tree whose root is the source node and whose branches end on the sinks. The routing tree, thus, originates from the source node and terminates at the sinks, encapsulating the optimal routing path for all nets. However, to achieve congestion-free routing trees, a router requires a minimal channel width or routing tracks. Considering FPGAs' fixed routing architecture, routing consumes a significant area of FPGA. Therefore, a larger channel width refers to an FPGA with a bigger routing area and vice versa.

In addition to the area, delay is another aspect that needs to be considered for FPGA configuration. Critical path delay (CPD) is a characteristic of any routing solution, typically represented by the branch from the source to the sink with the maximal time delay. A critical indicator of FPGA routing performance is speed, where speed depends upon the CPD characteristic of the FPGA. As a significant area of the FPGA consists of routing tracks, reducing the width of routing channels results in substantially reducing the area. In FPGA circuits, routing delay has a major contribution in total delay (logic and interconnects), whereas the speed of the FPGA depends on the CPD. Therefore, selecting faster routing resources renders a small CPD, thereby enabling circuit operation at higher speeds. The routing channels contain interconnects of varying lengths and delays. Each routing architecture has its own length of interconnects, and it is usually possible to join multiple interconnects using programmable switches (PS).

FPGA routers are typically based on a PathFinder routing method, implemented to concurrently address congestion elimination and critical path delay minimization within an iterative process. This method gradually adjusts the cost associated with routing resources to achieve an optimum distribution of the routing. Initially, the algorithm permits the sharing of resources among nets, subsequently determining the distribution of shared resources through a net-based negotiation process. Legal sharing of routing resources within a single net is facilitated to decrease overall wirelength. Each iteration involves the reevaluation and rerouting of nets until all resource sharing complies with legal constraints.

The PathFinder method is based on negotiated-congestion technique. The negotiated-congestion routing technique uses a penalty proportional to the over-usage of the routing resources to force detouring through un-congested interconnects. However, the negotiated-congestion routing technique can force the router to choose slow interconnects to reduce congestion, leading to an increase in CPD. Additionally, the PathFinder often suffers from the problem of deterioration of CPD when the channel widths are small because the congestion is high at those widths.

Therefore, there is a need to enhance the Path Finder method by redefining the negotiated congestion technique, which prioritizes the delay of the wires in selecting alternative wires to detour the routes and hence prevents deterioration of the CPD.

Accordingly, it is one object of the present disclosure to provide methods and systems for enabling PathFinder's negotiated congestion routing results in a smaller CPD, even for small channel widths.

SUMMARY

In an exemplary embodiment, a field programmable gate array (FPGA) routing tool in a computer-aided design system is disclosed. The tool includes an input device for receiving a netlist having source nodes, sink nodes, and a plurality of intermediate nodes at fixed positions and processing circuitry.

The processing circuitry is configured with a design router for determining routing interconnections between the source nodes and the sink nodes. The design router converges to an interconnection solution in which all signals are routed while achieving close to the optimal performance allowed by the fixed positions of the source nodes and the sink nodes. The design router includes a negotiated-congestion routing component which allows the interconnections to share the intermediate nodes and to negotiate for these intermediate nodes. The routing component uses a congestion cost which increases relative to increases in congestion in the intermediate nodes.

The congestion cost is a function of a base cost of a respective intermediate node, a historical cost of the respective intermediate node, a present usage cost of the respective intermediate node, and a usage and a capacity of the respective intermediate node, where the historical cost is an accumulated cost of the respective intermediate node.

The design router performs a historical cost function for the respective intermediate node that is based on the base cost of the respective intermediate node in order to force the design router to include intermediate nodes of a base cost that are lower than a baseline cost.

The tool further includes a display device to continuously display the interconnections and a routing utilization while the interconnections are being determined.

In one aspect of the embodiment, the processing circuitry is further configured to perform the historical cost function using a normalized base cost having a value that is between 0 and 1.

In one aspect of the embodiment, the processing circuitry is further configured to update the present usage cost after routing each intermediate node and the historical cost at an end of each iteration for all intermediate nodes.

In one aspect of the embodiment, the processing circuitry is configured to perform the historical cost function as a function of a previous historical cost and an update coefficient.

In one aspect of the embodiment, the processing circuitry is configured to perform the historical cost function of an intermediate node based on a condition that usage is greater than capacity.

In one aspect of the embodiment, the processing circuitry designs the FPGA to include an array of logic block (LB), digital signal processing (DSP) blocks, or memory blocks, routing channels, and programmable Switches.

In one aspect of the embodiment, the processing circuitry routes the interconnections following a pre-defined sequential order and relies on the negotiated-congestion routing component to alleviate congestion.

In one aspect of the embodiment, the router produces routing trees for all the interconnections, having a minimal channel width, to find congestion-free routing trees for the interconnections.

In one aspect of the embodiment, the router uses channel widths in a rage of 0.85 to 1.0 times the minimal channel width.

In one aspect of the embodiment, the router uses a channel width of 0.9 times the minimal channel width.

In another exemplary embodiment, a non-transitory computer-readable storage medium is disclosed. The non-transitory computer-readable storage medium includes computer executable instructions, where the instructions, when executed by a computer, cause the computer to perform a computer aided design method for designing routing for a field programmable gate array (FPGA). The method includes receiving a netlist having source nodes, sink nodes, and a plurality of intermediate nodes at fixed positions, and determining routing interconnections between the source nodes and the sink nodes that converge to an interconnection solution in which all signals are routed while achieving optimal performance allowed by the fixed positions of the source nodes and the sink nodes, negotiated-congestion routing which allows the interconnections to share the intermediate nodes and to negotiate for these intermediate nodes, the negotiated-congestion routing uses a congestion cost which increases relative to increases in congestion in the intermediate nodes.

The congestion cost is a function of a base cost of a respective intermediate node, a historical cost of the respective intermediate node, a present usage cost of the respective intermediate node, and a usage and a capacity of the respective intermediate node, where the historical cost is an accumulated cost of the respective intermediate node, and The method further includes performing a historical cost function for the respective intermediate node that is based on the base cost of the respective intermediate node in order to force the design routing to include intermediate nodes of a base cost that are lower than a baseline cost, and continuously display the interconnections and a routing utilization while the interconnections are being determined.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1A:
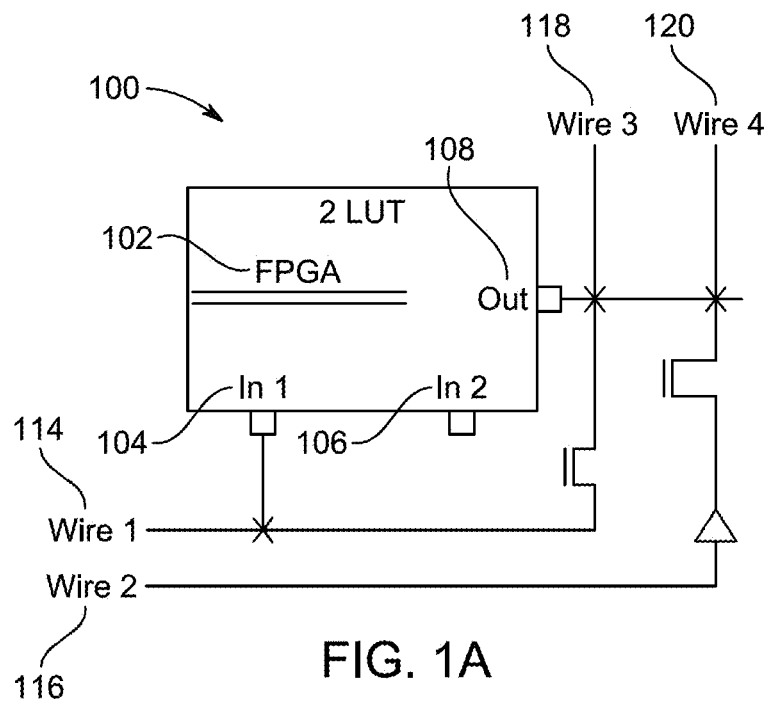
FIG. 1A illustrates an exemplary architecture of Field Programmable Gate Arrays (FPGAs), according to certain embodiments.

In the drawings, like reference numerals designate identical or corresponding parts throughout the several views. Further, as used herein, the words "a," "an" and the like generally carry a meaning of "one or more," unless stated otherwise.

Furthermore, the terms "approximately," "approximate," "about," and similar terms generally refer to ranges that include the identified value within a margin of 20%, 10%, or preferably 5%, and any values therebetween.

Aspects of this disclosure are directed to a system and method of routing in a computer-aided design (CAD) system for Field Programmable Gate Arrays (FPGAs). The routing tool comprises an input device and processing circuitry. The input device is tasked with receiving a netlist that includes source nodes, sink nodes, and a set of intermediate nodes at predetermined positions. The processing circuitry is equipped with a design router responsible for establishing routing interconnections between the source nodes and the sink nodes. The design router utilizes a negotiated-congestion routing component, which allows for shared use of intermediate nodes and facilitates negotiation for these nodes based on a calculated congestion cost. The congestion cost is derived from a combination of base, historical, and present usage costs of the intermediate nodes. The historical cost reflects the cumulative congestion of an intermediate node over time. Moreover, the router implements a historical cost function that encourages the selection of intermediate nodes with lower base costs. A display device is integrated to provide real-time visualization of the routing progress and resource utilization.

FIG. 1A illustrates an exemplary architecture of Field Programmable Gate Arrays (FPGAs), in accordance with certain embodiments. FPGAs are integrated circuits designed for configuration after manufacturing to realize various digital circuits. FPGAs include, but may not be limited to, a plurality of logic blocks (LBs), a plurality of digital signal processors (DSPs), and a plurality of memory blocks. The FPGA components are interconnected by routing channels equipped with programmable switches (PS). A routing channel, defined by its width (W), contains multiple wires. A plurality of connection blocks (CBs) connects LBs to routing channel wires, while switch blocks (SBs) link wires of intersecting or parallel routing channels. The wire's length (L) corresponds to the number of LBs it spans. FPGAs feature wires of varied lengths to accommodate different connection requirements, shorter wires for proximity connections and longer ones for extended connections.

The routing resources within an FPGA are denoted as a Routing Resource Graph (RRG), represented by G(V, E), where 'V' denotes routing resources (wires and pins), and 'E' symbolizes the switches. Routing challenges involve creating distinct trees for each net within a netlist, connecting respective pins without overlap. This task is acknowledged as NP-hard, particularly challenging within FPGAs due to their fixed routing architecture.

Routing software may approach this problem sequentially or concurrently. Sequential routers order nets and find routing trees following this sequence. Concurrent routers, alternatively, prebuilds several trees per net and resolve a mixed integer programming problem to determine the best routing.

Referring now to FIG. 1, there is shown a schematic representation of a routing system 100 for Field Programmable Gate Arrays (FPGAs), constructed in accordance with one embodiment. The system 100 is designed to facilitate the assignment of nets to routing resources, ensuring that no single routing resource is utilized by more than one net simultaneously. The system 100 includes an FPGA 102 comprising programmable logic blocks, such as look-up tables (LUTs), exemplified by a 2 LUT 104, which are operatively connected to input terminals, namely in 1 104 and in 2 106, and an output terminal out 108.

The logic blocks within FPGA 102 are interconnected via a plurality of wires, wire 1 114, wire 2 116, wire 3 118, and wire 4 120, that form part of the interconnect structure. These wires represent the programmable routing resources that can be configured to form the requisite connections for digital circuits implemented on the FPGA 102. In one exemplary implementation, wire 1 114 and wire 3 118 are interconnected bidirectionally, whereas wire 2 116 and wire 4 120 are interconnected unidirectionally, having NOT gate placed on the pathway. The routing system 100 operates on directed graph modelling, where the vertices symbolize the I/O terminals of the logic blocks and the routing wires of the interconnect structure. The edges in this abstraction represent the potential connections between vertices.

Figure 1B:
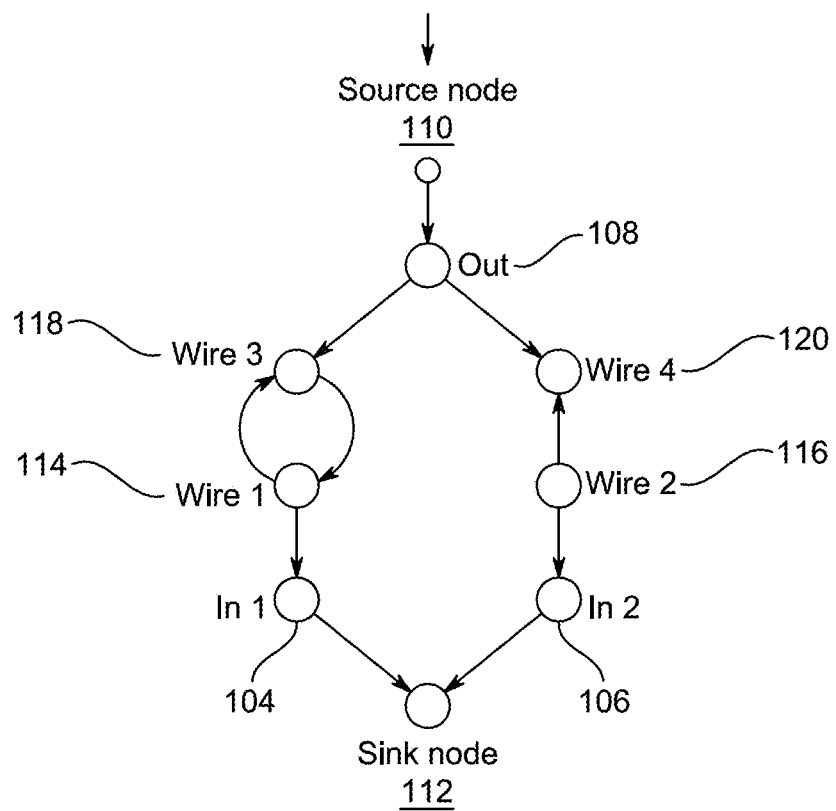
FIG. 1B illustrates a schematic of a routing tree depicting the interconnections of the components of FIG. 1A, according to certain embodiments.

FIG. 1B illustrates a schematic of a routing tree depicting the interconnections of the components of FIG. 1A, in accordance with certain embodiments. The source node 110 and sink node 112 are conceptual representations within the routing graph, denoting the origination and termination points for signal transmission, respectively. The source node 110 is an originating node of the routing tree, whereas the sink node 112 is a terminating node of the routing tree.

As depicted, the output terminal Out 108 has child nodes as wire 3 118 and wire 4 120. With reference to a first branch of the router tree, wire 3 118 is bidirectionally coupled to wire 114. Wire 1 is connected to the first input, in 1 104, and the sink node 112. With reference to a second branch of the router tree, wire 4 120 is connected to wire 2 116 unidirectionally, such that there is no flow from wire 4 120 to wire 2 116. The second branch terminates at the sink node 112.

To generate the router tree, the system 100, in one embodiment, implements the PathFinder, which iteratively routes nets through the FPGA 102 while negotiating the use of shared resources to prevent congestion. The PathFinder is a method utilized FPGA routing that employs a negotiated-congestion routing technique. The PathFinder permits nets to initially share routing resources, which are then allocated through negotiation. The PathFinder treats each net as a series of connections, routing each in succession, potentially reusing the previously established routing trees. This technique facilitates efficient resource utilization while addressing the inherent complexity of FPGA routing.

The PathFinder allows for the initial free routing of nets, followed by an increased cost imposition on routing resources based on their shared use and historical congestion, depicted in the negotiation through the graph's vertices.

The incremental cost associated with the use of a routing resource is calculated based on a predefined equation which takes into account the base cost, historical congestion, and current sharing level, thereby ensuring an optimized distribution of routing resources throughout the iterations of the routing process. Total cost determination is described with reference to FIG. 2.

Figure 2:
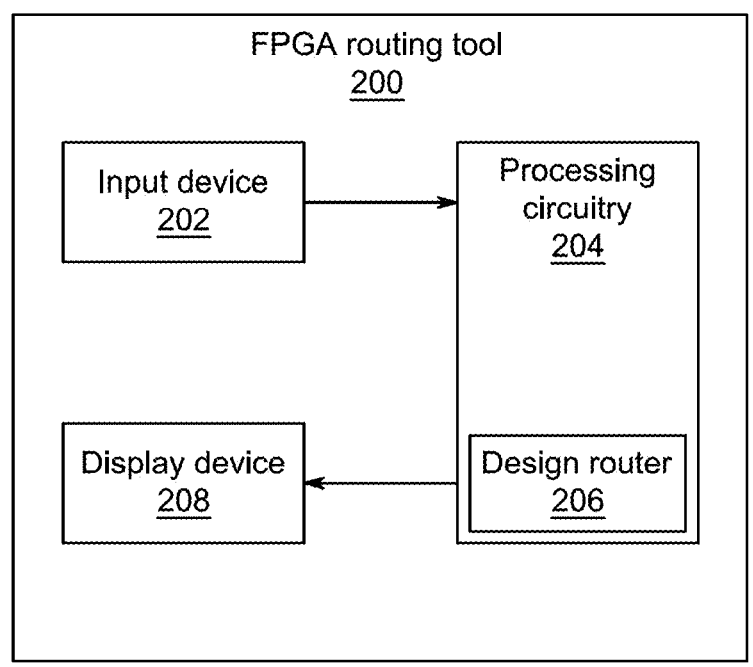
FIG. 2 depicts an exemplary block diagram of an FPGA routing tool, according to certain embodiments.

FIG. 2 depicts an exemplary block diagram of a computer-aided design system equipped with an FPGA routing tool 200, configured according to a preferred embodiment. The FPGA routing tool 200, alternatively referred as to a tool hereinafter, is structured to receive a netlist comprising source nodes, sink nodes, and a multiplicity of intermediate nodes at fixed positions via an input device 202. The tool includes a processing circuitry 204, configured for determining routing interconnections between the source and sink nodes. Within the processing circuitry 204, a design router 206 is implemented to converge upon an interconnection solution, whereby all signals are efficiently routed while attaining optimal performance as dictated by the fixed positions of the source and sink nodes.

The design router 206, in one aspect of the present embodiment, includes a negotiated-congestion routing component that allows for the sharing of intermediate nodes among the interconnections and subsequently orchestrates the negotiation for possession of these nodes. This negotiation is influenced by a congestion cost associated with each intermediate node. The congestion cost is a composite of a base cost, a historical cost reflective of past congestion, a present usage cost, and factors considering the usage and capacity of the intermediate node. In another aspect, the design router 206 is also tailored to apply a historical cost function to the intermediate nodes, emphasizing those with a base cost lower than a predetermined baseline, thereby steering the routing process toward less congested paths.

Additionally, the system is equipped with a display device 208, enabling the continuous visualization of the interconnection progress and the routing utilization status. The display device 208 offers a real-time representation of the routing process, enhancing user interaction and facilitating immediate adjustments where necessary.

The processing circuitry 204 is further engineered to execute the historical cost function based on a normalized base cost, updating the present usage cost post-routing of each intermediate node, and revising the historical cost at the conclusion of each iteration cycle. The tool's design accommodates the use of channel widths within a specified range of the minimal channel width necessary for the circuit, operationalizing the routing process in a sequential order and leveraging the negotiated-congestion routing component to alleviate congestion effectively.

Moreover, the processing circuitry 204 is configured to design the FPGA with an array of logic blocks, DSP blocks, memory blocks, routing channels, and programmable switches, meticulously routing the interconnections to construct congestion-free routing trees. This intricate design enables the FPGA to execute the disclosed functions while adhering to the constraints and capacities of the hardware resources.

A model of the negotiated congestion routing is described hereinafter. A fundamental element of negotiated congestion routing is the congestion cost of the nodes or routing resources, which increases in every iteration in response to the congestion. The congestion cost of the nodes reflects their present and past congestion. In the latest version of PathFinder, the congestion code of a node $v \in V$ is given by:

$$c(v) = b(v) \times h(v) \times p(v)$$

$$b(v) = T_d(v) \times l(v) \quad \quad (1) \text{ and } (2)$$

In the above equation, $b(v)$ denotes the base cost of a node, $T_d(v)$ and $l(v)$ denote the average time delay per unit length of the node v, and wire-length of node v, respectively. $h(v)$ denotes the history cost or accumulated cost of the node v, and $p(v)$ denotes the present usage cost.

$$p(v) = \begin{cases} 1 + p_f(u(v) + 1 - e(v)), & \text{if } u(v) \geq e(v) \\ 1, & \text{otherwise} \end{cases}$$

In the above expressions, $p_f$ and $h_f$ denote the update coefficients of the present usage and history costs. $u(v)$ denote the current usage, and $e(v)$ denotes the capacity of the node. The variable i denotes the current iteration of the router. The values of $p(v)$ are updated after routing each net and $h(v)$ at the end of each iteration for all nodes. The value of $p_f$ in each iteration is also updated as $p_f = \Delta P \times p_f$. It is observed that this increase in the coefficient of the present cost could make the routing too much dependent on the ordering of the nets. The nets that are later in the order experience a higher cost than those that are earlier in the order. Therefore, they suggested keeping $p_f$ constant through the routing process.

Each circuit given to PathFinder has a minimal channel width ($W_m$), the smallest channel width necessary to route the given circuit. In one aspect, smaller channel widths are defined as $xW_m$, where $x \in \{0,1\} \in R$, and smaller channel widths are even smaller than $W_m$. It is observed that the behaviour of PathFinder at the smaller channel width while allowing it to execute more iterations necessary to converge to a legal solution.

Figure 3:
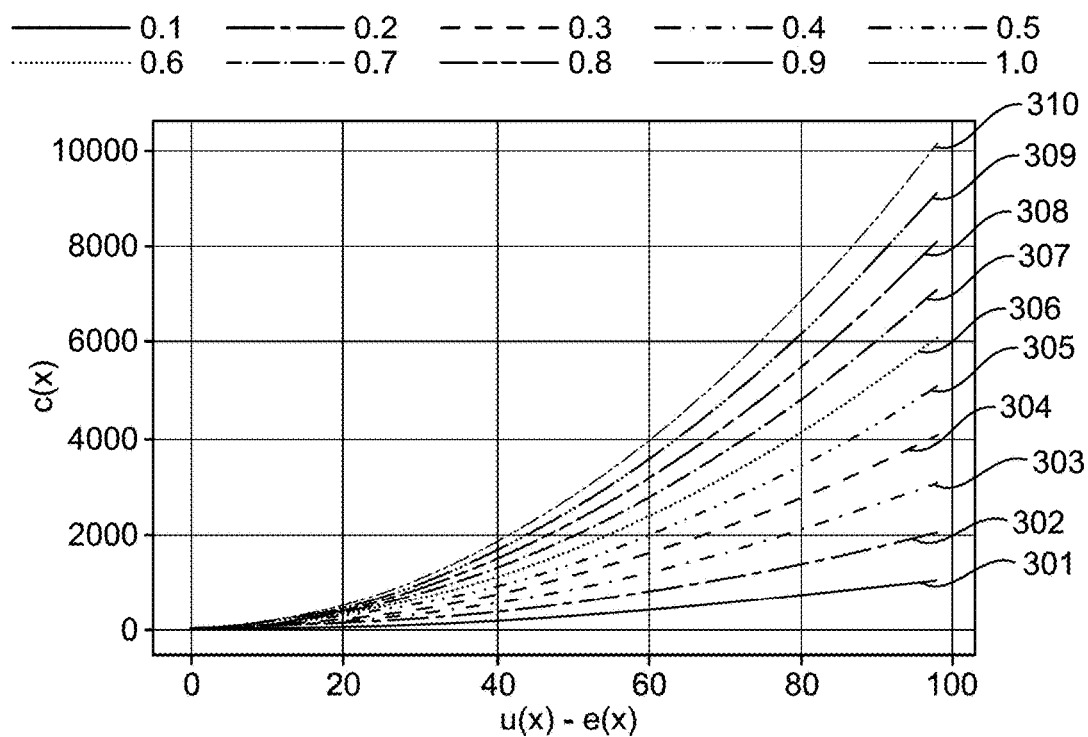
FIG. 3 is a graphical representation of change in congestion cost and the over usage of routing resources for various base cost values derived by using the standard historical cost function, according to certain embodiments.

FIG. 3 is a graph of change in congestion cost c(x), and the over usage of routing resources, expressed as u(x)−e(x), for various base cost values, b(x), ranging from 0.1 to 1.0, $b(x) \in \{0.1, 1.0\}$. This figure visualizes the standard historical cost function, where the historical cost factor, hf, and the present usage cost factor, pf, are set to 1. The curves of the graph are plotted c(x) and u(x)−e(x) for specific base cost value. Curve 301 is plotted for base cost 0.1, Curve 302 is plotted for base cost 0.2, Curve 303 is plotted for base cost 0.3, Curve 304 is plotted for base cost 0.4, Curve 305 is plotted for base cost 0.5, Curve 306 is plotted for base cost 0.6, Curve 307 is plotted for base cost 0.7, Curve 308 is plotted for base cost 0.8, Curve 309 is plotted for base cost 0.9, and Curve 310 is plotted for base cost 1.0.

In the standard negotiated congestion method applied within PathFinder, the congestion cost for nodes that are excessively utilized is escalated to encourage the rerouting of nets via nodes with lower congestion levels. It has been observed that this method may inadvertently guide the nets towards nodes with a higher base cost but lower current usage. This can result in a routing outcome that is not optimal, where routing trees excessively utilize nodes with high base costs despite the presence of available alternatives with lower base costs.

According to the present embodiment, an enhanced historical cost function is to be incorporated into PathFinder's negotiated congestion technique, with the goal of elevating the quality of the routing solution. The enhanced historical cost function is designed to prioritize the base cost over the extent of over usage. By doing so, the router is biased towards including nodes with lower base costs in the routing trees for the nets, thereby avoiding the sub-optimal preference for high-cost nodes irrespective of their current usage.

Considering a node v having base cost $b(v)$, usage $u(v)$, capacity $e(v)$, historical cost of the previous and current iterations $h^{i-1}(v)$ and $h^i(v)$, respectively, and present usage cost $p(v)$, using (3) and (4), the congestion cost under the condition $u(v) > e(v)$ can be written as follows.

$$c(v) = b(v)(h^{i-1}(v) + h_f(u(v) - e(v)))(1 + p_f(u(v) - e(v)) + 1)) \quad (5)$$

Simplifying the above equation using $X = u(v) - e(v)$, and skipping writing $(v)$ for the sake of clarity can change it as follows.

$$c = b(h^{i-1} + h_f X)(1 + p_f(X+1)) = bh^{i-1} + bh^{i-1} p_f(X+1) + bh_f X + bh_f X p_f(X+1) = bh^{i-1} + bh^{i-1} p_f X + bh^{i-1} p_f + bh_f X + bh_f p_f X^2 + bh_f p_f X = X^2(bh_f p_f) + X(bh^{i-1} p_f + bh_f + bh_f p_f) + (bh^{i-1} + bh^{i-1} p_f) \quad (6)$$

Since, $b$, $h_f$, $p_f$, and $h^{i-1}$ are positive numbers, the above equation is quadratic with positive coefficients, therefore the curve is a parabola that opens upwards. The graph in FIG. 3 shows the curves of the congestion cost at different overusage $(u(x) - e(x))$ values for different base costs $(b(x) \in \{0,1\})$, and $h_f$, $p_f = 1$. It is observed from the curves that the congestion cost of a node strongly depends on its overusage, and with the help of grid lines, it can be seen that nodes with a smaller base cost can have a higher congestion cost than the nodes with a higher base cost because of having more overusage.

The present disclosure presents an enhanced historical cost function for PathFinder's negotiated congestion technique to improve the solution quality. The historical cost function, as disclosed, depends primarily on the base cost instead of the over usage, thus forcing the router to not avoid nodes of smaller base costs in finding routing trees for the nets. The enhanced historical cost $h^i(v)$ (where $v \in V$) is given by:

$$h^i(v) = \begin{cases} 1, & \text{if } i = 1 \\ h^{i-1}(v) + h_f + (u(v) - e(v))^{b_N(v)}, & \text{if } u(v) > e(v) \\ h^{i-1}(v), & \text{otherwise} \end{cases}$$

The historical cost function contains the normalized base cost ($b_N(x)$) in the exponent, and the value of $b_N(v)$ lies between 0 and 1. Re-defining (6) using the present historical cost function results in the following expression.

$$c = b(h^{i-1} + h_f + (X)^{b_N})(1 + p_f(X+1)) \quad (8)$$
$$= (bh^{i-1} + bh_f + bX^{b_N})(1 + p_f X + p_f)$$
$$= X^{b_N+1}(bp_f) + X(p_f bh^{i-1} + p_f bh_f) + X^{b_N}(b + bp_f) + (bh^{i-1} + bh_f + bh^{i-1} p_f + bh_f p_f)$$

In the above equation, the value of $b_N \in \{0,1\}$, and hence depending on the value of $b_N$, the congestion cost can be a quadratic function or sub-quadratic function. The curves of sub-quadratic function rise more slowly than the quadratic functions.

Figure 4:
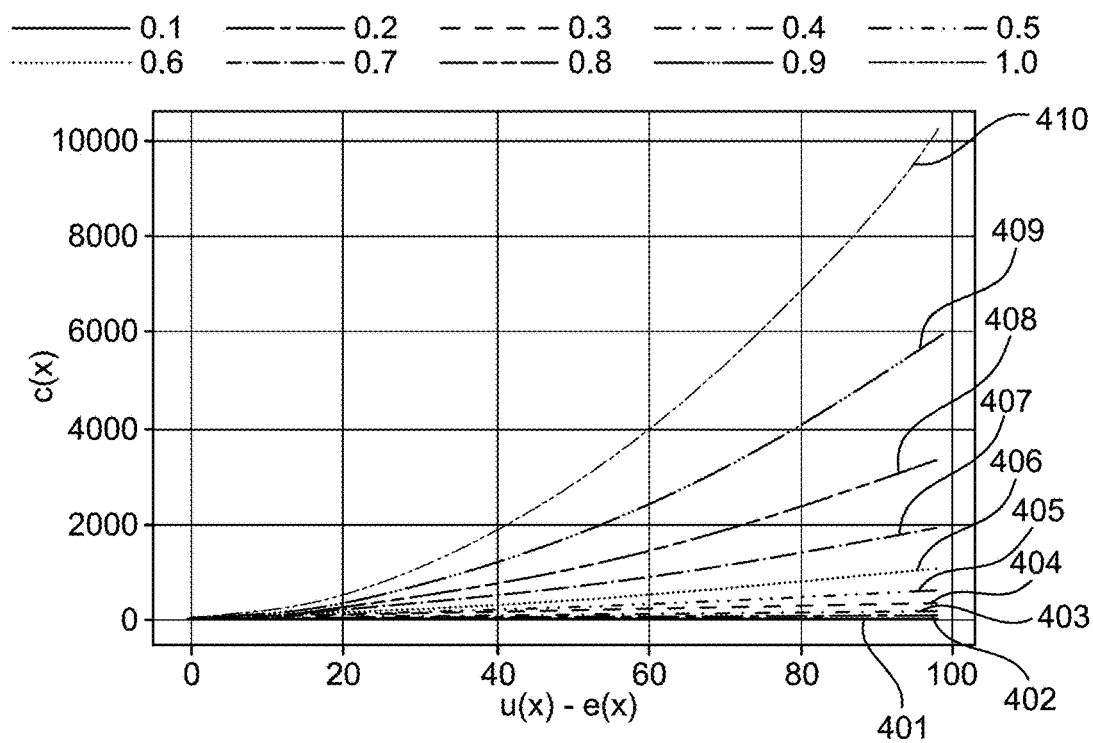
FIG. 4 is a graphical representation of change in congestion cost and the over usage of routing resources for various base cost values derived by using the enhanced historical cost function, according to certain embodiments.

FIG. 4 is a graph of change in congestion cost $c(x)$, and the over usage of routing resources, expressed as $u(x) - e(x)$, for various base cost values, $b(x)$, ranging from 0.1 to 1.0, $b(x) \in \{0.1, 1.0\}$ (represented by curves 401 to 410). This figure visualizes the application of the enhanced historical cost function with the historical cost factor, $h_f$, and the present usage cost factor, $p_f$, are set as 1. FIG. 3 presents the curve of the congestion cost using the present historical cost function, the curves are subquadratic when $b_N \neq 1$. It is shown that the curves with a higher $b_N$ are much steeper than the curves with a smaller $b_N$ value. Comparing the curves in FIG. 3 and FIG. 4, it is observed that using the present historical cost function, the nodes with a smaller $b_N$ have more tendency to have a smaller congestion cost as compared the nodes having a larger $b_N$ value despite having more overusage.

In one aspect of the present embodiment, Monte-Carlo simulations are conducted to find the percentage of cases using the existing and present cost function in which $c(x)$ becomes smaller than $c(y)$ when $b(x) < b(y)$. It can be assumed that all variables belonging to uniform random distribution between 0 and 1, i.e., $U(0,1)$, the values of $p_f$ and $h_f$ are equal to 1, and number of trials is equal to 1e6. The results show that in using the standard cost functions, $c(x)$ becomes greater than $c(y)$ even when $b(x) < b(y)$ in 18.29% cases. In using the present cost function, this percentage reduces to 12.0%. These Monte-Carlo simulations show that the present cost function can help to avoid the cases when $c(x) > c(y)$ and $b(x) < b(y)$ and has the potential to improve the routing quality.

Upon comparing the plotted curves in FIG. 3 and FIG. 4, it is observed that the present historical cost function leads to a lower congestion cost for nodes with a smaller base cost, despite higher overutilization. This is in contrast to nodes with a higher base cost value, where the congestion cost escalates with increased overutilization. This demonstrates the effectiveness of the present cost function in maintaining lower congestion costs, particularly for nodes with lower base costs.

In a preferred implementation, the historical cost function within PathFinder of the Verilog-to-Routing (VTR) 8.0 suite has been refined with the introduction of the present cost function. Evaluations were carried out using the Titan23 benchmark suite, recognized for its relevance to the latest FPGA industrial applications and integral to VTR 8.0 assessments. Of the twenty-three Titan problems, three were excluded due to routing ability constraints, resulting in twenty problems subjected to testing. These tests employed the Stratix-IV FPGA architecture model. Each of the twenty benchmark problems underwent ten unique trials, with each trial being paired with a distinct placement solution. The minimal channel width necessary for successful routing by PathFinder was identified for each benchmark problem within the default iteration ceiling.

PathFinder's performance may then be gauged across channel widths at 85%, 90%, 95%, and 100% of this minimal width, denoted as Wm. Widths below the minimal threshold are explored to potentially reduce FPGA area, with the selection of widths ranging from 85% to 100%, as widths under 85% result in non-routeable outcomes, and those above 100% increase area usage unnecessarily. To ensure the attainment of viable solutions, the maximum iteration limit for PathFinder was augmented from 50 to 500. The computational platform for these experiments is a desktop equipped with an Intel i5-11500 six-core CPU and 64 GB of RAM.

The correlation between channel width reduction and FPGA routing area diminution has been demonstrated. In the below table, the initial column lists the benchmark names, followed by columns reflecting the relative decrease in routing area at the specified channel widths. Instances of unrouteable configurations are indicated by dashes in the table. The data presented signifies that narrower channel widths correlate with decreased routing areas.

Subsequent tables detail the comparative advantages of the present cost function over the standard one in terms of critical path delay (CPD), runtime, and wire-length metrics. For clarity, results for the present cost function are enumerated in the numerator, while those for the standard cost function reside in the denominator. Consequently, values less than one signify improvements attributable to the present cost function. These tables, representing the findings from ten trials for each problem, exhibit results for the full spectrum of tested channel widths. Instances of unrouteable configurations at certain channel widths are again marked with dashes.

The benefit of employing the enhanced historical cost function is particularly evident in CPD reductions across channel widths from 85% to 100%. At the 85% channel width, PathFinder successfully routes ten problems, with the present cost function yielding CPD reductions between 0.585 and 1.002 in 80% of cases. At a 90% channel width, the routing success extends to eighteen problems, and the CPD reduction spans from 0.543 to 1.011, marking improvements in 94% of cases. Stability in routing is observed at a 95% channel width with CPD reductions ranging from 0.772 to 1.011 in 77% of problems. Lastly, at the full 100% channel width, the CPD changes fluctuate between 0.991 and 1.009, demonstrating enhancements in half of the test cases, while the remainder closely align with the baseline.

Table I shows the fold change in the FPGA routing area when the channel width is reduced. In Table I, the first column contains the problem names, and the remaining columns contain the fold change in the FPGA routing area for channel widths equal to 1.0, 0.95, 0.90, and 0.85. Table I also contains "-" at some positions that indicate that the circuit is unrouteable at that channel width. The results show that reducing the channel width also reduces the FPGA routing area.

TABLE I

FOLD CHANGE IN THE FPGA ROUTING AREA AT DIFFERENT CHANNEL WIDTHS

| | Channel widths | | | |
|---|---|---|---|---|
| Problem | 1.0 | 0.95 | 0.90 | 0.85 |
| neuron | 1.0 | 0.957 | 0.914 | 0.872 |
| sparcT1_core | 1.0 | 0.945 | 0.891 | 0.857 |
| stereo_vision | 1.0 | 0.954 | 0.914 | 0.873 |
| cholesky_mc | 1.0 | — | — | — |
| des90 | 1.0 | 0.953 | 0.912 | 0.865 |
| sparcT1_chip2 | 1.0 | 0.964 | 0.912 | — |
| sparcT2_core | 1.0 | 0.955 | 0.908 | 0.888 |
| stap_qrd | 1.0 | — | — | — |
| segmentation | 1.0 | 0.959 | 0.901 | 0.887 |
| bitonic_mesh | 1.0 | 0.955 | 0.912 | 0.874 |
| cholesky_bdti | 1.0 | 0.962 | 0.943 | — |
| dart | 1.0 | 0.954 | 0.918 | — |
| denoise | 1.0 | 0.958 | 0.917 | — |
| gsm_switch | 1.0 | 0.95 | 0.91 | — |
| LU230 | 1.0 | 0.965 | 0.927 | — |
| LU_Network | 1.0 | 0.957 | 0.9 | 0.847 |
| mes_noc | 1.0 | 0.953 | 0.908 | 0.861 |
| minres | 1.0 | 0.947 | 0.907 | — |
| openCV | 1.0 | 0.957 | 0.913 | 0.864 |
| SLAM_spheric | 1.0 | 0.948 | 0.907 | — |

Tables II through IV illustrate the comparative performance of PathFinder employing the present cost function versus the standard cost function across various metrics: Critical Path Delay (CPD), runtime, and wire-length. The fold change is calculated with the present cost function outcomes as numerators and the standard function outcomes as denominators. Hence, values below unity suggest improvements due to the present cost function. These tables present averaged results from ten distinct trials for each problem, across channel widths of 0.85, 0.90, 0.95, and 1.0. Dashes indicate unrouteable circuits at specific channel widths.

Table II details the impact of the present cost function on CPD for channel widths between 0.85 and 1.0. For a channel width of 0.85, ten problems are routable with fold changes in CPD ranging from 0.585 to 1.002, showing improvements in 80% of the cases. With the channel width at 0.90, up to eighteen problems are routable, exhibiting fold changes from 0.543 to 1.011, with gains in nearly 94% of instances. At a channel width of 0.95, routability mirrors that at 0.90, with fold changes spanning 0.772 to 1.011 and enhancements in 77% of problems. Finally, at a channel width of 1.0, the fold change in CPD fluctuates between 0.991 and 1.009, indicating betterment in half of the test cases, while the remainder are comparable to the base function.

TABLE II

FOLD CHANGE IN THE AVERAGE CPD VALUES BY USING THE PRESENT COST FUNCTION

| | Channel Widths | | | |
|---|---|---|---|---|
| Problem | 0.85 | 0.90 | 0.95 | 1.0 |
| neuron | 0.873 | 0.967 | 0.999 | 1.0 |
| sparcT1_core | 0.662 | 0.761 | 0.955 | 0.998 |
| stereo_vision | 0.852 | 0.881 | 0.906 | 0.961 |
| cholesky_mc | — | — | — | 0.991 |
| des90 | 1.002 | 0.996 | 0.997 | 1.0 |
| sparcT1_chip2 | — | 0.977 | 1.006 | 1.003 |
| sparcT2_core | 0.999 | 0.923 | 0.96 | 0.995 |
| stap_qrd | — | — | — | 1.004 |
| segmentation | 0.991 | 0.994 | 0.997 | 0.999 |

TABLE II-continued

FOLD CHANGE IN THE AVERAGE CPD VALUES BY USING THE PRESENT COST FUNCTION

| | Channel Widths | | | |
|---|---|---|---|---|
| Problem | 0.85 | 0.90 | 0.95 | 1.0 |
| bitonic_mesh | 0.718 | 0.823 | 0.937 | 0.976 |
| cholesky_bdti | — | 0.848 | 0.947 | 0.997 |
| dart | — | 0.792 | 0.954 | 0.977 |
| denoise | — | 0.997 | 0.999 | 0.999 |
| gsm_switch | — | 0.543 | 0.772 | 1.003 |
| LU230 | — | 0.999 | 0.999 | 1.0 |
| LU_Network | 0.585 | 0.946 | 0.945 | 1.009 |
| mes_noc | 1.005 | 1.011 | 1.011 | 1.01 |
| minres | — | 0.933 | 0.953 | 0.989 |
| openCV | 0.954 | 0.996 | 1.001 | 1.001 |
| SLAM_spheric | — | 0.987 | 1.0 | 1.0 |

Table III displays the fold change in runtime across various channel widths. With the channel width set at 0.85, the present cost function markedly enhances runtime for 9 out of 10 problems. At a channel width of 0.90, improvements in runtime are observed in half of the eighteen problems tested. Similar performance enhancements are noted at channel widths of 0.95 and 1.0 with the implementation of the present cost function.

Table III shows the fold change in runtime at different channel widths. At a channel width of 0.85, the present cost function significantly improves the runtime in 9/10 problems. When the channel width is 0.90, the present cost function improves the runtime in nine out of eighteen problems. When the channel width is 0.95 and 1.0, the present cost function.

TABLE III

FOLD CHANGE IN THE AVERAGE RUNTIME IN USING PATHFINDER WITH THE PRESENT COST FUNCTION

| | Channel Widths | | | |
|---|---|---|---|---|
| Problem | 0.85 | 0.90 | 0.95 | 1.0 |
| neuron | 0.408 | 1.148 | 1.097 | 0.914 |
| sparcT1_core | 0.356 | 0.66 | 1.523 | 2.366 |
| stereo_vision | 0.857 | 1.19 | 1.31 | 1.321 |
| cholesky_mc | — | — | — | 0.978 |
| des90 | 0.515 | 0.556 | 0.578 | 0.581 |
| sparcT1_chip2 | — | 0.316 | 1.081 | 1.772 |
| sparcT2_core | 0.819 | 1.461 | 1.654 | 1.12 |
| stap_qrd | — | — | — | 1.121 |
| segmentation | 1.763 | 1.876 | 3.167 | 4.974 |
| bitonic_mesh | 0.16 | 0.423 | 1.062 | 1.19 |
| cholesky_bdti | — | 1.789 | 1.816 | 1.437 |
| dart | — | 0.257 | 2.275 | 2.325 |
| denoise | — | 5.664 | 8.946 | 9.466 |
| gsm_switch | — | 0.738 | 1.921 | 1.737 |
| LU230 | — | 8.56 | 6.169 | 6.157 |
| LU_Network | 0.364 | 0.475 | 1.266 | 1.711 |
| mes_noc | 0.616 | 1.035 | 1.545 | 1.139 |
| minres | — | 1.591 | 3.092 | 2.67 |
| openCV | 0.687 | 0.722 | 0.742 | 0.714 |
| SLAM_spheric | — | 0.599 | 1.598 | 2.923 |

Table IV presents data on the fold change in the usage of wire segments within Stratix-IV FPGA routing architectures, specifically concerning L4 and L16 wire segments, as delineated in the referenced literature. Notably, L4 segments are shorter and provide quicker signal propagation compared to L16 segments. The data indicate an increased employment of L4 segments coupled with a reduced usage of L16 segments when applying the present cost function. This suggests that the present cost function prompts PathFinder to preferentially utilize shorter wire segments, contributing to the minimization of critical path delay (CPD).

TABLE IV

FOLD CHANGE IN THE UTILIZATION OF WIRE-SEGMENTS (L4 AND L16) IN USING PATHFINDER WITH THE PRESENT COST FUNCTION

| | Channel Widths | | | | | | | |
|---|---|---|---|---|---|---|---|---|
| | 0.85 | | 0.90 | | 0.95 | | 1.0 | |
| Problem | L4 | L16 | L4 | L16 | L4 | L16 | L4 | L16 |
| neuron | 1.027 | 0.984 | 1.054 | 1.016 | 1.064 | 1.024 | 1.065 | 1.017 |
| sparcT1_core | 0.908 | 0.859 | 0.952 | 0.911 | 1.001 | 0.973 | 1.021 | 0.995 |
| stereo_vision | 1.049 | 0.996 | 1.05 | 0.999 | 1.048 | 0.992 | 1.046 | 0.989 |
| choleskymc | — | — | — | — | — | — | 1.055 | 0.99 |
| des90 | 1.056 | 0.98 | 1.052 | 0.965 | 1.051 | 0.969 | 1.05 | 0.98 |
| sparcT1_chip2 | — | — | 1.031 | 0.966 | 1.051 | 0.977 | 1.056 | 0.983 |
| sparcT2_core | 1.054 | 1.044 | 1.043 | 1.009 | 1.054 | 1.019 | 1.055 | 1.02 |
| stap_qrd | — | — | — | — | — | — | 1.06 | 0.983 |
| segmentation | 0.995 | 0.941 | 1.014 | 0.972 | 1.028 | 0.961 | 1.048 | 0.97 |
| bitonic_mesh | 0.997 | 0.918 | 1.042 | 0.938 | 1.058 | 0.956 | 1.065 | 0.953 |
| cholesky_bdti | — | — | 1.029 | 0.971 | 1.038 | 0.97 | 1.048 | 0.974 |
| dart | — | — | 0.99 | 0.924 | 1.035 | 0.981 | 1.057 | 1.006 |
| denoise | — | — | 1.042 | 0.996 | 1.057 | 1.0 | 1.062 | 0.994 |
| gsm_witch | — | — | 1.006 | 0.923 | 1.052 | 0.929 | 1.078 | 0.923 |
| LU230 | — | — | 1.122 | 0.836 | 1.117 | 0.848 | 1.118 | 0.845 |
| LU_Network | 1.051 | 0.977 | 1.08 | 0.986 | 1.093 | 0.967 | 1.099 | 0.966 |
| mes_noc | 1.058 | 1.003 | 1.056 | 0.992 | 1.055 | 0.988 | 1.053 | 0.98 |
| minres | — | — | 1.066 | 1.008 | 1.086 | 1.008 | 1.089 | 1.019 |
| openCV | 1.051 | 0.988 | 1.048 | 0.995 | 1.045 | 0.991 | 1.043 | 0.991 |
| SLAM_spheric | — | — | 0.953 | 0.901 | 1.014 | 0.954 | 1.053 | 0.977 |

Table V details the application of the paired T-test to evaluate the null hypothesis positing equal mean results for PathFinder when utilizing standard versus present cost functions. This statistical approach is appropriate due to the unique placement associated with each result. The table outlines T-statistic and P-value metrics across the spectrum of channel widths. T-test analysis of CPD data across all evaluated channel widths, from 0.85 to 1.0, yields P-values below the 0.05 significance level and positive T-statistic values. Accordingly, the null hypothesis is rejected, confirming that the CPD outcomes with the present cost function are statistically superior to those produced by the standard function. Additionally, runtime T-test outcomes indicate that, at a channel width of 0.85, PathFinder performs more expediently with the present cost function than with the standard. Detailed experimental findings are accessible in the cited document for the convenience and further scrutiny of readers.

TABLE V

RESULTS OF THE PAIRED T-TESTS

|  | Channel width | T-statistic | P-value | Effect |
|---|---|---|---|---|
| CPD | 0.85 | 4.9656 | 9.4481e−6 | + |
|  | 0.90 | 6.5681 | 1.7042e−9 | + |
|  | 0.95 | 5.6976 | 8.5885e−8 | + |
|  | 1.0 | 3.1581 | 0.0019 | + |
| runtime | 0.85 | 3.4788 | 0.0009 | + |
|  | 0.90 | −0.94141 | 0.3479 | − |
|  | 0.95 | −3.1379 | 0.0020 | − |
|  | 1.0 | −3.5288 | 0.0005 | − |

The present disclosure has introduced an enhanced historical cost function for the negotiated congestion method in PathFinder. This function aims to maintain quality critical path delay (CPD) outcomes even when operating within reduced channel widths. The function is designed to prioritize wire delay, thereby reducing the selection of slower wires during the congestion negotiation process. The present cost function has been incorporated into the current version of PathFinder, specifically VTR 8.0, and conducted an evaluation using the Titan23 benchmark suite. The results demonstrate that the present cost function facilitates improvements in CPD for the majority of problems at channel widths of 0.85 Wm, 0.90 Wm, 0.95 Wm, and 1.0 Wm, where Wm signifies the minimal channel width that PathFinder requires to route a circuit. Statistical analysis employing the paired T-test supports the significance of these CPD improvements. In an embodiment, the present cost function can be amalgamated with acceleration techniques to enhance both CPD and runtime performance.

Figure 5:
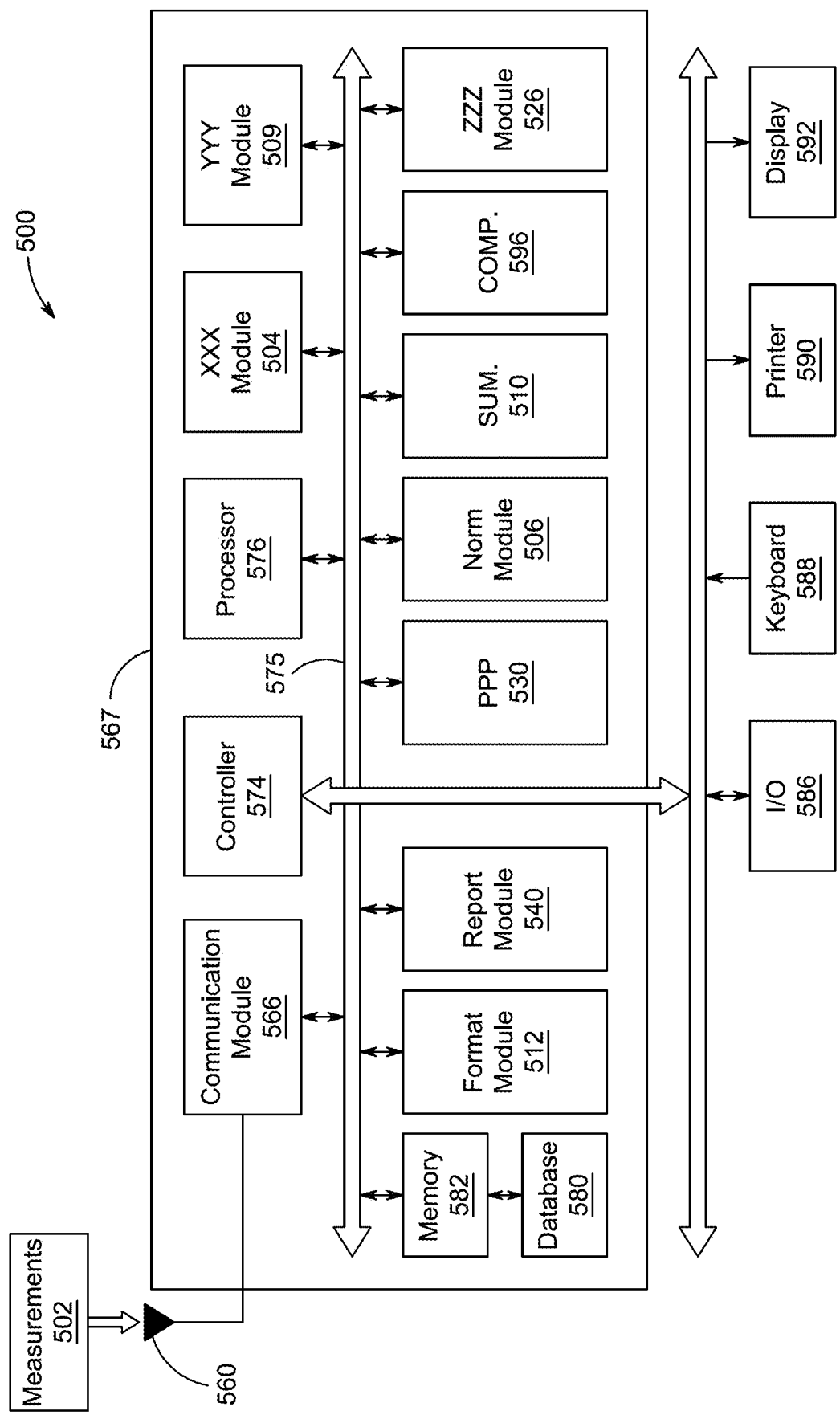
FIG. 5 illustrates hardware components of the computing environment, according to certain embodiments.
Figure 6:
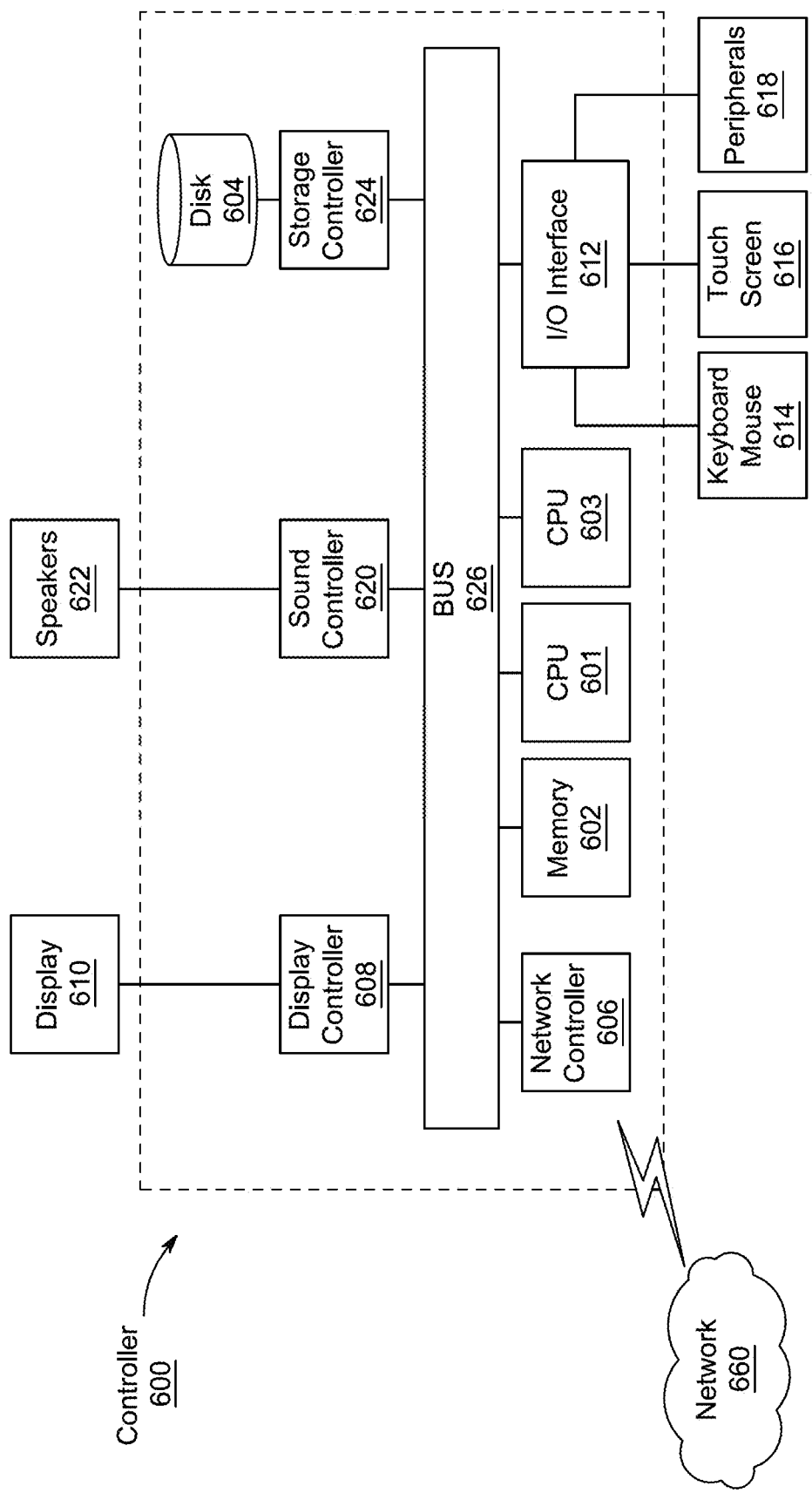
FIG. 6 is an illustration of a non-limiting example of details of computing hardware used in the computing system, according to certain embodiments.

Next, further details of the hardware description of the computing environment of FIG. 5 according to exemplary embodiments is described with reference to FIG. 6. In FIG. 6, a controller 600 is described is representative of the tool 200 of FIG. 2 in which the controller is a computing device which includes a CPU 601 which performs the processes described above/below. The process data and instructions may be stored in memory 602. These processes and instructions may also be stored on a storage medium disk 604 such as a hard drive (HDD) or portable storage medium or may be stored remotely.

Further, disclosed embodiments are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computing device communicates, such as a server or computer.

Further, disclosed embodiments may be provided as a utility application, background daemon, or component of an operating system, or combination thereof, executing in conjunction with CPU 601, 603 and an operating system such as Microsoft Windows 7, Microsoft Windows 10, UNIX, Solaris, LINUX, Apple MAC-OS and other systems known to those skilled in the art.

The hardware elements in order to achieve the computing device may be realized by various circuitry elements, known to those skilled in the art. For example, CPU 601 or CPU 603 may be a Xenon or Core processor from Intel of America or an Opteron processor from AMD of America, or may be other processor types that would be recognized by one of ordinary skill in the art. Alternatively, the CPU 601, 603 may be implemented on an FPGA, ASIC, PLD or using discrete logic circuits, as one of ordinary skill in the art would recognize. Further, CPU 601, 603 may be implemented as multiple processors cooperatively working in parallel to perform the instructions of the inventive processes described above.

The computing device in FIG. 6 also includes a network controller 606, such as an Intel Ethernet PRO network interface card from Intel Corporation of America, for interfacing with network 660. As can be appreciated, the network 660 can be a public network, such as the Internet, or a private network such as an LAN or WAN network, or any combination thereof and can also include PSTN or ISDN subnetworks. The network 660 can also be wired, such as an Ethernet network, or can be wireless such as a cellular network including EDGE, 3G and 4G wireless cellular systems. The wireless network can also be WiFi, Bluetooth, or any other wireless form of communication that is known.

The computing device further includes a display controller 608, such as a NVIDIA GeForce GTX or Quadro graphics adaptor from NVIDIA Corporation of America for interfacing with display 610, such as a Hewlett Packard HPL2445w LCD monitor. A general purpose I/O interface 612 interfaces with a keyboard and/or mouse 614 as well as a touch screen panel 616 on or separate from display 610. General purpose I/O interface also connects to a variety of peripherals 618 including printers and scanners, such as an OfficeJet or DeskJet from Hewlett Packard.

A sound controller 620 is also provided in the computing device such as Sound Blaster X-Fi Titanium from Creative, to interface with speakers/microphone 622 thereby providing sounds and/or music.

The general purpose storage controller 624 connects the storage medium disk 604 with communication bus 626, which may be an ISA, EISA, VESA, PCI, or similar, for interconnecting all of the components of the computing device. A description of the general features and functionality of the display 610, keyboard and/or mouse 614, as well as the display controller 608, storage controller 624, network controller 606, sound controller 620, and general purpose I/O interface 612 is omitted herein for brevity as these features are known.

The exemplary circuit elements described in the context of the present disclosure may be replaced with other elements and structured differently than the examples provided herein. Moreover, circuitry configured to perform features described herein may be implemented in multiple circuit units (e.g., chips), or the features may be combined in circuitry on a single chipset, as shown on FIG. 7.

Figure 7:
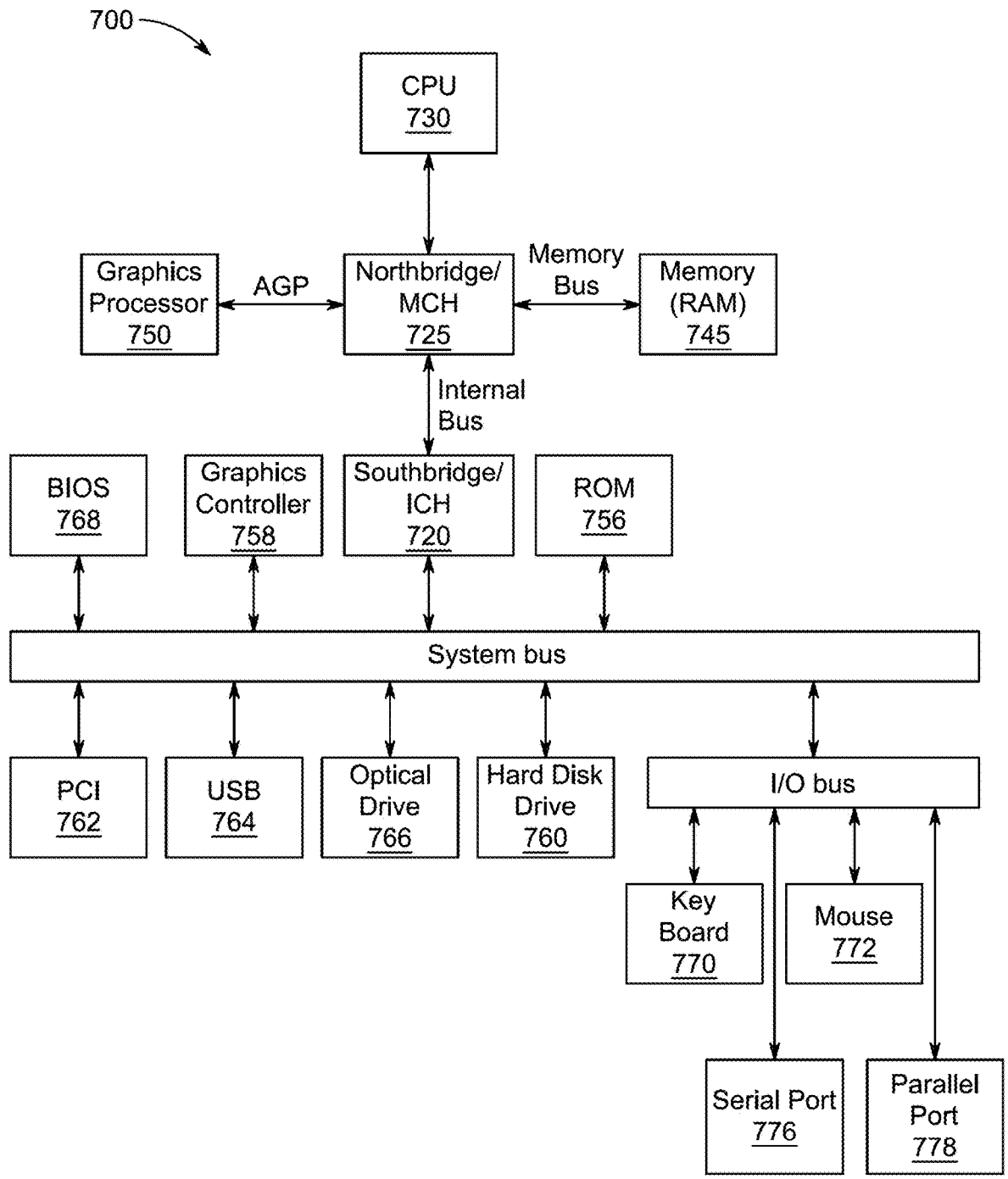
FIG. 7 is an exemplary schematic diagram of a data processing system used within the computing system, according to certain embodiments.

FIG. 7 shows a schematic diagram of a data processing system, according to certain embodiments, for performing the functions of the exemplary embodiments. The data processing system is an example of a computer in which code or instructions implementing the processes of the illustrative embodiments may be located.

In FIG. 7, data processing system 700 employs a hub architecture including a north bridge and memory controller hub (NB/MCH) 725 and a south bridge and input/output (I/O) controller hub (SB/ICH) 720. The central processing unit (CPU) 730 is connected to NB/MCH 725. The NB/MCH 725 also connects to the memory 745 via a memory bus and connects to the graphics processor 750 via an accelerated graphics port (AGP). The NB/MCH 725 also connects to the SB/ICH 720 via an internal bus (e.g., a unified media interface or a direct media interface). The CPU Processing unit 730 may contain one or more processors and even may be implemented using one or more heterogeneous processor systems.

Figure 8:
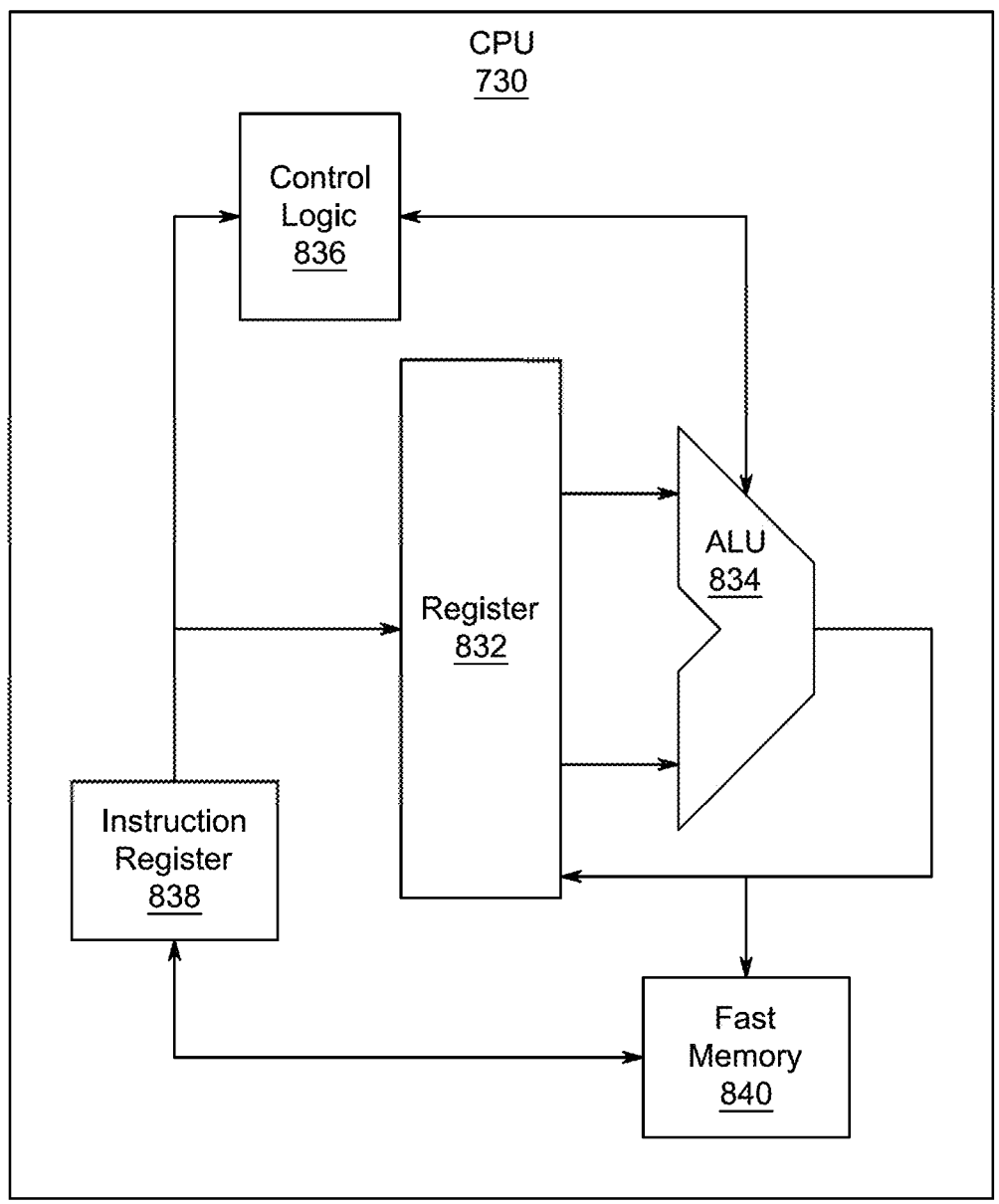
FIG. 8 is an exemplary schematic diagram of a processor used with the computing system, according to certain embodiments.

For example, FIG. 8 shows one implementation of CPU 730. In one implementation, the instruction register 838 retrieves instructions from the fast memory 840. At least part of these instructions is fetched from the instruction register 838 by the control logic 836 and interpreted according to the instruction set architecture of the CPU 730. Part of the instructions can also be directed to the register 832. In one implementation the instructions are decoded according to a hardwired method, and in another implementation the instructions are decoded according to a microprogram that translates instructions into sets of CPU configuration signals that are applied sequentially over multiple clock pulses. After fetching and decoding the instructions, the instructions are executed using the arithmetic logic unit (ALU) 834 that loads values from the register 832 and performs logical and mathematical operations on the loaded values according to the instructions. The results from these operations can be feedback into the register and/or stored in the fast memory 840. According to certain implementations, the instruction set architecture of the CPU 730 can use a reduced instruction set architecture, a complex instruction set architecture, a vector processor architecture, a very large instruction word architecture. Furthermore, the CPU 730 can be based on the Von Neuman model or the Harvard model. The CPU 730 can be a digital signal processor, an FPGA, an ASIC, a PLA, a PLD, or a CPLD. Further, the CPU 730 can be an x86 processor by Intel or by AMD; an ARM processor, a Power architecture processor by, e.g., IBM; a SPARC architecture processor by Sun Microsystems or by Oracle; or other known CPU architecture.

Referring again to FIG. 7, the data processing system 700 can include that the SB/ICH 720 is coupled through a system bus to an I/O Bus, a read only memory (ROM) 756, universal serial bus (USB) port 764, a flash binary input/output system (BIOS) 768, and a graphics controller 758. PCI/PCIe devices can also be coupled to SB/ICH 788 through a PCI bus 762.

The PCI devices may include, for example, Ethernet adapters, add-in cards, and PC cards for notebook computers. The Hard disk drive 760 and CD-ROM 766 can use, for example, an integrated drive electronics (IDE) or serial advanced technology attachment (SATA) interface. In one implementation the I/O bus can include a super I/O (SIO) device.

Further, the hard disk drive (HDD) 760 and optical drive 766 can also be coupled to the SB/ICH 720 through a system bus. In one implementation, a keyboard 770, a mouse 772, a parallel port 778, and a serial port 776 can be connected to the system bus through the I/O bus. Other peripherals and devices that can be connected to the SB/ICH 720 using a mass storage controller such as SATA or PATA, an Ethernet port, an ISA bus, a LPC bridge, SMBus, a DMA controller, and an Audio Codec.

Moreover, the present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

Figure 9:
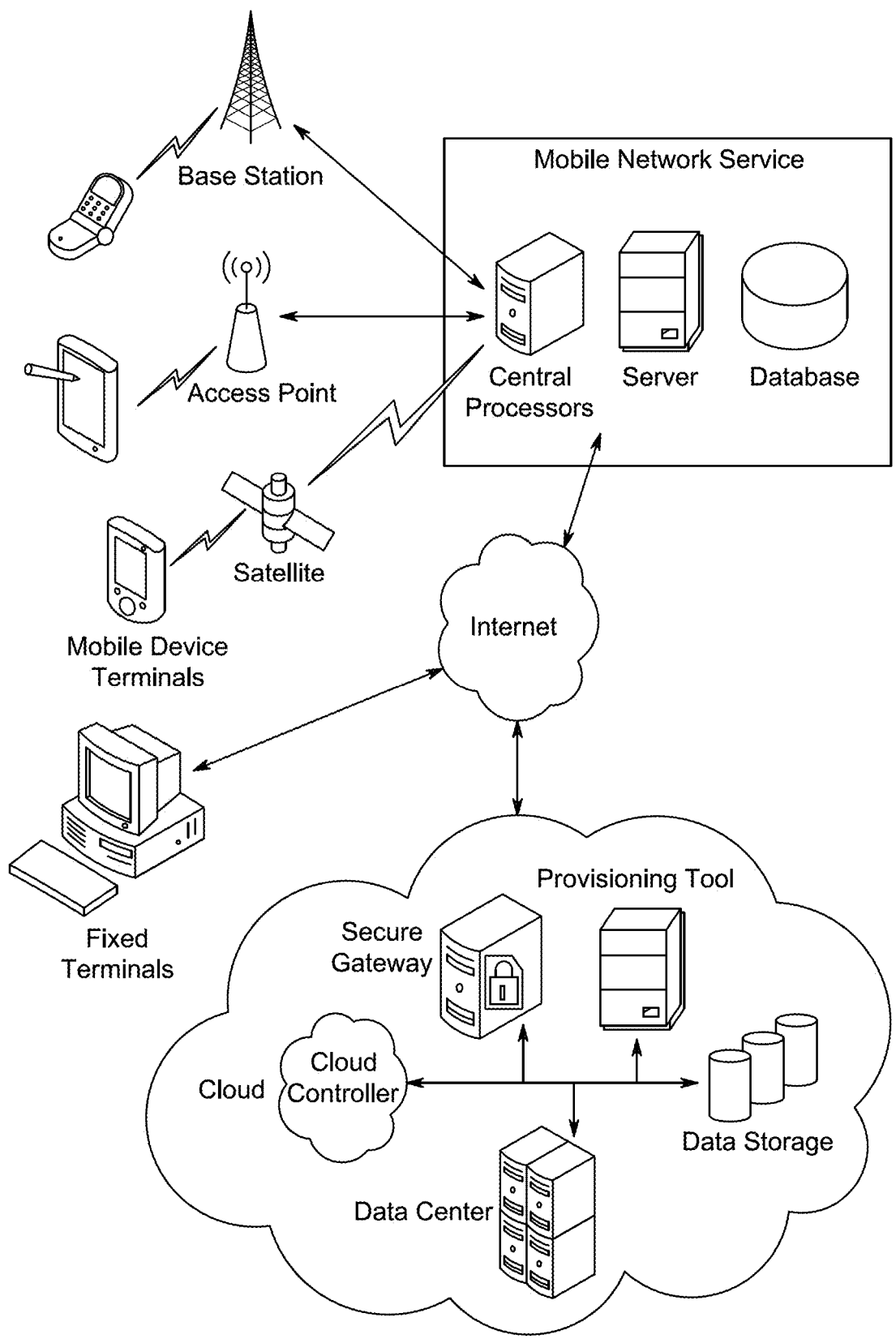
FIG. 9 is an illustration of a non-limiting example of distributed components which may share processing with the controller, according to certain embodiments.

The functions and features described herein may also be executed by various distributed components of a system. For example, one or more processors may execute these system functions, wherein the processors are distributed across multiple components communicating in a network. The distributed components may include one or more client and server machines, which may share processing, as shown by FIG. 9, in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

Numerous modifications and variations of the present disclosure are possible in light of the above teachings. It is therefore to be understood that the invention may be practiced otherwise than as specifically described herein.

The invention claimed is:

1. A method for fabricating a digital circuit using a field programmable gate array (FPGA), the FPGA comprising (1) a plurality of programmable logic blocks for implementing a plurality of digital logics and (2) a plurality of programmable routing resources for connecting or disconnecting inputs and outputs of the plurality of programmable logic blocks, the method comprising:

designing the FPGA with a computer-aided design system implementing a routing tool, the designing step further including:
via an input device of the computer-aided design system, receiving a netlist representing a target digital circuit to be fabricated, the netlist having source nodes, sink nodes, and a plurality of intermediate nodes at fixed positions,
via a design router of the computer-aided design system, determining routing interconnections between the source nodes and the sink nodes,
via a display device of the computer-aided design system, continuously displaying the interconnections and a routing utilization while the interconnections are being determined, and
via the design router, making adjustments to the routing interconnections, based on user feedback on the interconnections and routing utilization displayed at the display device; and configuring, based on the routing interconnections determined in the designing step, the plurality of programmable routing resources, such that the inputs and outputs of the plurality of programmable logic blocks are selectively connected or disconnected to form the target digital circuit, wherein the design router converges to an interconnection solution in which all signals are routed while achieving close to an optimal performance allowed by the fixed positions of the source nodes and the sink nodes, wherein the design router includes a negotiated-congestion routing component which allows the interconnections to share the intermediate nodes and to negotiate for these intermediate nodes, the routing component using a congestion cost which increases relative to increases in congestion in the intermediate nodes, wherein the congestion cost is a function of a base cost of a respective intermediate node, a historical cost of the respective intermediate node, a present usage cost of the respective intermediate node, and a usage and a capacity of the respective intermediate node, where the historical cost is an accumulated cost of the respective intermediate node, and wherein the design router performs a historical cost function for the respective intermediate node that is based on the base cost of the respective intermediate node in order to force the design router to include intermediate nodes of a base cost that are lower than a baseline cost.

2. The method of claim 1, wherein the design router is further configured to perform the historical cost function using a normalized base cost having a value that is between 0 and 1.

3. The method of claim 1, wherein the design router is further configured to update the present usage cost after routing each intermediate node and the historical cost at an end of each iteration for all intermediate nodes.

4. The method of claim 1, wherein the design router is configured to perform the historical cost function as a function of a previous historical cost and an update coefficient.

5. The method of claim 1, wherein the design router is configured to perform the historical cost function of an intermediate node based on a condition that usage is greater than capacity.

6. The method of claim 1, wherein the FPGA includes an array of logic block (LB), digital signal processing (DSP) blocks, or memory blocks, routing channels, and programmable Switches.

7. The method of claim 1, wherein the design router routes the interconnections following a pre-defined sequential order and relies on the negotiated-congestion routing component to alleviate congestion.

8. The method of claim 7, wherein the design router produces routing trees
for all the interconnections, having a minimal channel width, to find congestion-free routing trees for the interconnections.

9. The method of claim 8, wherein the design router uses channel widths in a rage of 0.85 to 1.0 times the minimal channel width.

10. The method of claim 9, wherein the design router uses a channel width of 0.9 times the minimal channel width.

11. A non-transitory computer-readable storage medium including computer executable instructions, wherein the instructions, when executed by a computer, cause the computer to perform a method for fabricating a digital circuit using a field programmable gate array (FPGA), the FPGA comprising (1) a plurality of programmable logic blocks for implementing a plurality of digital logics and (2) a plurality of programmable routing resources for connecting or disconnecting inputs and outputs of the plurality of programmable logic blocks, the method comprising:

designing the FPGA with a computer-aided design system implementing a routing tool, the designing step further including:
via an input device of the computer-aided design system, receiving a netlist representing a target digital circuit to be fabricated, the netlist having source nodes, sink nodes, and a plurality of intermediate nodes at fixed positions,
via a design router of the computer-aided design system, determining routing interconnections between the source nodes and the sink nodes,
via a display device of the computer-aided design system, continuously displaying the interconnections and a routing utilization while the interconnections are being determined, and
via the design router, making adjustments to the routing interconnections, based on user feedback on the interconnections and routing utilization displayed at the display device; and
configuring, based on the routing interconnections determined in the designing step, the plurality of programmable routing resources, such that the inputs and outputs of the plurality of programmable logic blocks are selectively connected or disconnected to form the target digital circuit, wherein the design router converges to an interconnection solution in which all signals are routed while achieving optimal performance allowed by the fixed positions of the source nodes and the sink nodes;

wherein the design router performs negotiated-congestion routing which allows the interconnections to share the intermediate nodes and to negotiate for these intermediate nodes, the negotiated-congestion routing using a congestion cost which increases relative to increases in congestion in the intermediate nodes, wherein the congestion cost is a function of a base cost of a respective intermediate node, a historical cost of the respective intermediate node, a present usage cost of the respective intermediate node, and a usage and a capacity of the respective intermediate node, where the historical cost is an accumulated cost of the respective intermediate node, and wherein the design router performs a historical cost function for the respective intermediate node that is based on the base cost of the respective intermediate node in order to force the design routing to include intermediate nodes of a base cost that are lower than a baseline cost.

12. The non-transitory computer-readable storage medium of claim 11, wherein the design router performs the historical cost function using a normalized base cost having a value that is between 0 and 1.

13. The non-transitory computer-readable storage medium of claim 11, wherein the design router updates the present usage cost after routing each intermediate node and the historical cost at an end of each iteration for all intermediate nodes.

14. The non-transitory computer-readable storage medium of claim 11, wherein the design router performs the historical cost function as a function of a previous historical cost and an update coefficient.

15. The non-transitory computer-readable storage medium of claim 11, wherein the design router performs the historical cost function of an intermediate node based on a condition that usage is greater than capacity.

16. The non-transitory computer-readable storage medium of claim 11, wherein the FPGA includes an array of logic block (LB), digital signal processing (DSP) blocks, or memory blocks, routing channels, and programmable Switches.

17. The non-transitory computer-readable storage medium of claim 11, wherein the design router routes the interconnections following a pre-defined sequential order and uses the negotiated-congestion routing to alleviate congestion.

18. The non-transitory computer-readable storage medium of claim 17, wherein the design router produces routing trees for all the interconnections, having a minimal channel width, to find congestion-free routing trees for the interconnections.

19. The non-transitory computer-readable storage medium of claim 18, wherein the design router uses channel widths in a rage of 0.85 to 1.0 times the minimal channel width.

20. The non-transitory computer-readable storage medium of claim 19, wherein the design router uses a channel width of 0.9 times the minimal channel width.

* * * * *